United States Patent

Foster et al.

[11] Patent Number: 5,824,157
[45] Date of Patent: Oct. 20, 1998

[54] FLUID JET IMPREGNATION

[75] Inventors: Elizabeth F. Foster, Friendsville, Pa.; Jeffrey C. Hedrick, Park Ridge, N.J.; Robert M. Japp, Vestal, N.Y.; Konstantinos Papathomas, Endicott, N.Y.; Stephen L. Tisdale, Enowell, N.Y.; Alfred Viehbeck, Fishkill, N.Y.

[73] Assignee: International Business Machines Corporation, Armonk, N.Y.

[21] Appl. No.: 523,881

[22] Filed: Sep. 6, 1995

[51] Int. Cl.⁶ ...................................................... B05C 3/12
[52] U.S. Cl. .................. 118/419; 118/405; 118/410; 118/411; 118/413; 118/414; 118/429
[58] Field of Search ..................... 118/313, 314, 118/325, 405, 410, 411, 413, 414, 419, 429, 677, 679, 683, 684; 68/205 R, 19.1, 20; 162/184, 185, 186, 265, 266

[56] References Cited

U.S. PATENT DOCUMENTS

| | | |
|---|---|---|
| 3,682,185 | 8/1972 | Murray et al. ........................... 118/405 |
| 4,142,010 | 2/1979 | Pipkin et al. . |
| 4,174,261 | 11/1979 | Pellegrino . |
| 4,203,257 | 5/1980 | Jamison et al. . |
| 4,299,186 | 11/1981 | Pipkin et al. . |
| 4,358,332 | 11/1982 | Rodish ..................... 118/313 |
| 4,387,124 | 6/1983 | Pipkin et al. . |
| 4,447,924 | 5/1984 | Bolton et al. ........................... 68/19.1 |
| 4,836,133 | 6/1989 | Wohrle et al. . |
| 4,889,073 | 12/1989 | Meinander ............................. 118/413 |
| 5,063,951 | 11/1991 | Bard et al. ................................ 134/64 |
| 5,192,394 | 3/1993 | Bard et al. . |
| 5,289,639 | 3/1994 | Bard et al. . |
| 5,614,264 | 3/1997 | Himes ..................... 118/314 |
| 5,622,599 | 4/1997 | Sproule et al. ........................ 162/265 |

*Primary Examiner*—Donald E. Czaja
*Assistant Examiner*—Michael P. Colaianni
*Attorney, Agent, or Firm*—Daniel P. Morris

[57] ABSTRACT

The invention involves a fluid treatment device to solution or melt impregnate a resin or polymer or any combination thereof into a reinforcement which can be utilized to fabricate composite materials for laminates, circuit boards, structural/aerospace materials, automotive components, etc. The invention offers significant advantages and benefits over existing methods and equipment and allows the impregnation process to be performed at lower cost and higher efficiency with increased environmental safety.

18 Claims, 6 Drawing Sheets

FLUID JET IMPREGNATION

CROSS-REFERENCE TO RELATED APPLICATIONS

The teaching of U.S. application Ser. No. 08/523,969 (now abandoned in favor of continuing application Ser. No. 08/770,058, filed Dec. 19, 1996, filed on the same day herewith, entitled "Fluid Jet Impregnation and Coating Device with Thickness Control Capability" to E. Foster et al., is incorporated herein by reference.

The teaching U.S. application Ser. No. 08/523,883 (now abandoned in favor of continuing application Ser. No. 08/770,067 filed on Dec. 19, 1996, filed on the same day herewith, entitled "Expandable Fluid Treatment Device For Tubular Surface Treatments" to E. Foster et al., is incorporated herewith by reference.

TECHNICAL FIELD

The invention is directed to a method and apparatus for the impregnation of a reinforcement material with a resin/polymer solution or hot melt with a fluid jet device.

BACKGROUND OF THE INVENTION

Composite materials are typically composed of a polymer and a reinforcement. The polymer can be thermoplastic or thermoset and may be either in the form of a hot melt or solvent solution. The reinforcement typically serves to improve structural integrity and is most commonly in the form of a continuous fiber, a woven fabric or a compressed mat.

Composites are usually fabricated in a multistage process. The first stage involves the impregnation of the polymer into a reinforcement. Conventional impregnation processes involve the immersion of the reinforcement into a dip tank of the resin/polymer solution or hot melt. This dip tank usually contains squeeze rollers to facilitate "wetting" (e.g., penetration of the resin or polymer) of the reinforcement. The coated reinforcement is then passed between metering rollers (outside the dip pan) to assure proper uptake of the resin or polymer. The impregnated material then passes into an oven to volatilize the solvent (if present) and usually to react the resin/polymer to a predetermined molecular weight. From this point the material formed is typically referred to as prepreg. Prepreg can then be combined with other materials, such as copper, and with additional processing laminates or other articles may be formed.

Conventional impregnation processes, while useful, are disadvantageous because the quality of the prepreg formed is dictated by several complex factors such as the residence time in the dip pan, the solution or melt viscosity, the metering roller gap, reinforcement web speed, reinforcement coupler treatment, etc. Most of these variables influence the penetration and wetability of the resin/polymer solution or hot melt in the reinforcement. Good wetability is essential in the fabrication of both high quality void-free prepreg and laminates produced therefrom.

Referring to FIG. 7, in a conventional dip pan, the resin volume 102 required to achieve a sufficient residence time (soak time) to facilitate proper penetration of the resin/polymer solution or hot melt is approximately 200 gallons on the manufacturing scale. Volumes of this magnitude create two problems; (i) excessive waste is created (100 plus gallons) each time the resin/polymer is changed and (ii) due to large exposed surface areas solvent (if present) is lost into the environment and must be replaced to maintain a constant viscosity. Reinforcement 108 is fed from seed roll 110 on which it is wound into resin 102 in tank 100 through rollers 106 and 104 which squeeze the resin into the spaces with reinforcement from rollers 104 and 106, the reinforcement is directed out of resin 102 through metering rollers 112 and 114 which squeeze off the excess resin which drip 116 back into tank 100. From metering rollers 112 and 114, reinforcement 108 passes through processing unit 118 which provides heat to cure the resin impregnated reinforcement. The cured reinforcement is wound on take up roller 120. In addition, large amounts of air which are often dragged into the resin by the reinforcement 108 as it enters the resin 102 and can create bubbles within the resin which can cause defects or voids in the prepreg.

An additional problem with a conventional impregnation apparatus is the presence of metering 112, 114 and squeeze rollers 104, 106, since they present the opportunity for static charge to build up thus creating an explosion/fire hazard when utilizing low boiling, flammable solvents. The prior art apparatus shown in FIG. 7 uses a large open tank having a large volume of resin which contains a large amount of the flammable solvent. Since the atmosphere surrounding the tank will contain oxygen and since the static charges can build up on reinforcement 108 as it passes through the atmosphere, there is a high explosion hazard.

Bard et al. in U.S. Pat. Nos. 5,063,951, 5,192,394, and 5,289,639 describe a fluid treatment apparatus and method for cleaning/rinsing substrates (e.g., a thin, metallic sheet). An apparatus of this type if properly modified could serve to solution or melt impregnate resin/polymer into a reinforcement (a continuous fiber, woven fabric, compressed mat, etc.).

OBJECTS

It is an object of the present invention is to enhance the art of fluid impregnation devices.

It is another object of the present invention to use a fluid jet treatment for solution or melt impregnation of a resin or polymer.

It is another object of the present invention to eliminate the need for a large resin/polymer dip pan thus reducing expense, waste and the emission of volatile chemicals into the environment.

It is another object of the present invention to use significantly smaller resin/polymer volumes (1/10 of less) through the use of fluid jet treatment because the resin/polymer solution or hot melt would be recycled.

It is another object of the present invention be significantly improved resin penetration into the reinforcement with a fluid treatment due to improved flow dynamics thus allowing for improved wetability, a decrease in voids, improved prepreg quality, etc.

It is another object of the present invention to improve the processability of a resin/polymer at a higher solids content, thus allowing for increased through-put (faster line speeds) and reduced emissions of solvents and/or potentially harmful materials (e.g., pollutants).

It is another object of the present invention to provide a fluid treatment method and apparatus which is designed to degas the resin/polymer solution which reduces void formation in a prepreg.

It is another object of the present invention to provide a method and apparatus in which the flow dynamics inside the fluid treatment apparatus facilitate impregnation of filled (particulate of otherwise) resin/polymer systems by eliminating settling or floatation segregation due to resin/polymer versus filler density differences.

It is another object of the present invention to provide a method and apparatus which eliminates the dip pan and the squeeze rollers reducing the opportunity for static charge to build up thus decreasing the explosion/fire hazard created with use of low boiling, flammable solvents.

It is another object of the invention to provide a fluid treatment device capable of applying fluids to a substrate with relative precision and in a facile manner.

It is another object of the present invention to provide such a device which operates in a relatively simplistic manner and which can be produced relatively inexpensively.

SUMMARY OF THE INVENTION

In accordance with one aspect of the invention, there is defined a device for applying fluid to a reinforcement, the device including at least one head member which includes therein means for directing a first fluid at an established first pressure against the reinforcement and means for directing a second fluid at an established second pressure (at a location of fluid intersection) against the reinforcement such that the first fluid impingement on the reinforcement can be limited to a predetermined location.

An additional aspect of the invention includes a fluid treatment device consisting of two parallel head members with at least one row, preferably an array of several rows, of fluid jet injectors. Reinforcement in the form of a continuous fiber, woven fabric, compressed mat etc. is transported between the parallel head members in a direction which is substantially parallel to an axis associated with the apparatus surface, extending from the entrance edge to the exit edge, with the row(s) of fluid jet injectors aligned transversely to this axis. During its transport, the reinforcement is saturated with a resin/polymer solution or hot melt expelled from the fluid jet injectors. Simultaneously, the pressure is reduced on the opposite side of the reinforcement by mechanical means thus creating a pressure differential; this facilitates penetration of the resin/polymer solution or hot melt and allows for the collection, degassing and recycling of the resin/polymer. Overflow of the resin/polymer solution or hot melt is controlled by variation of the fluid jet injectors and the applied pressure differential.

BRIEF DESCRIPTION OF THE DRAWINGS

For a better understanding of the present invention, together with other and further objects, advantages and capabilities thereof, reference is made to the following disclosure and appended claims in connection with the above described drawings.

DETAILED DESCRIPTION OF THE INVENTION

In FIGS. 1–5, there is shown a resin impregnation device 10 in accordance with an embodiment of the invention. As understood from the following, the invention is capable of applying fluids (such as an epoxy resin/methyl ethyl ketone solution) to a reinforcement (such as a woven glass cloth) while effecting relatively high mass transfer rates to a desired area thereon and while substantially limiting the interaction with the external atmosphere. Most significantly, the device as taught herein insures relatively precise impingement of the fluid to a selected area of the reinforcement, such precision deemed essential in the manufacture of various products such as prepregs for microelectronic packages and structural articles such as those utilized in the fabrication of aircraft. Accordingly, the invention as defined herein is particularly adapted for use in such manufacture and particularly wherein such manufacture involves the use of epoxy resins of the like as the primary treatment fluid. The invention is not limited to epoxy resins, however, in that other fluids may be readily utilized using the present invention. This invention is thus considered to represent a significant advancement in the art of resin impregnation devices.

Figure 7:
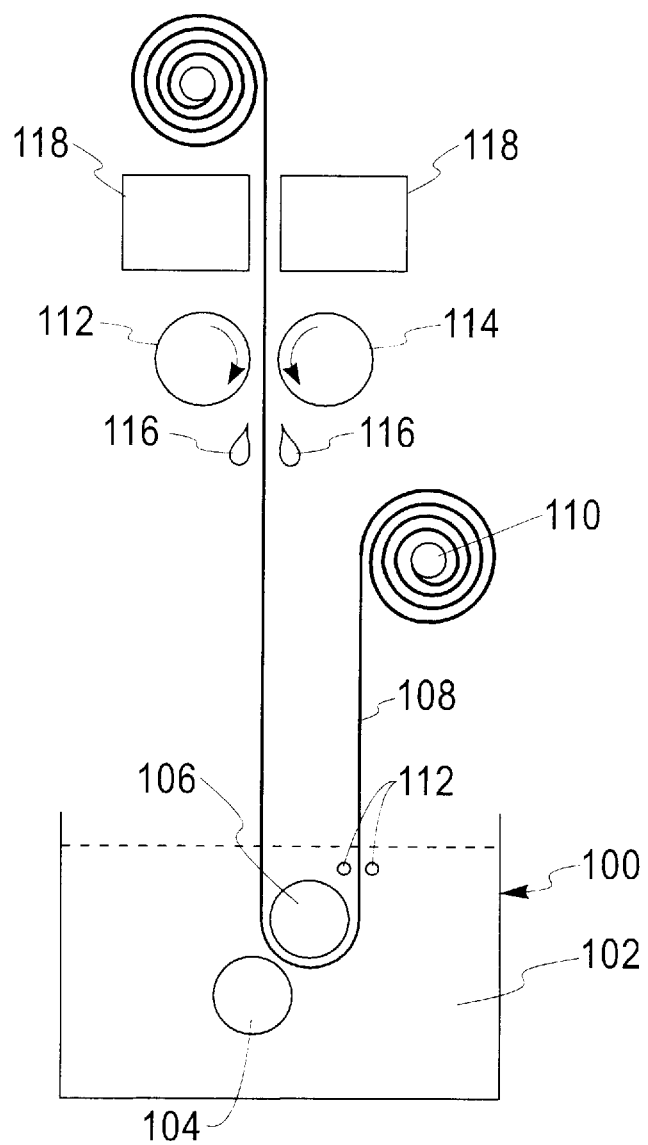
FIG. 7 is a schematic diagram of the prior art apparatus used to impregnate reinforcement for use in printed circuit boards.

A device according to the present invention provides a compact means for impregnating a reinforcement with a resin without the requirement of a large deep tank and without the explosion hazard of the prior art apparatus shown in FIG. 7.

Device 10 comprises at least one head member 11 which includes therein means 13 (which can be a machined metal member) for directing a first fluid 15 (represented by the solid arrows in FIG. 2) of an established first pressure against a first, predetermined location 17 located on a reinforcement 19 positioned within device 10. In one embodiment of the invention, first fluid 15 is an epoxy resin solution in methyl ethyl ketone (MEK) and is applied against a location 17 on a woven glass cloth reinforcement 19. The epoxy resin is utilized to coat the glass reinforcement 19 before subsequently being employed as a printed circuit board material.

As stated, device 10 is capable of treating other types of reinforcement material, including aramid and carbon based materials, if desired. Furthermore, the reinforcement can be in the form of a woven fabric, compressed mat, single filament fiber toe, etc.. Thus, the invention is not limited to a particular type of fluid or reinforcement.

Figure 2:
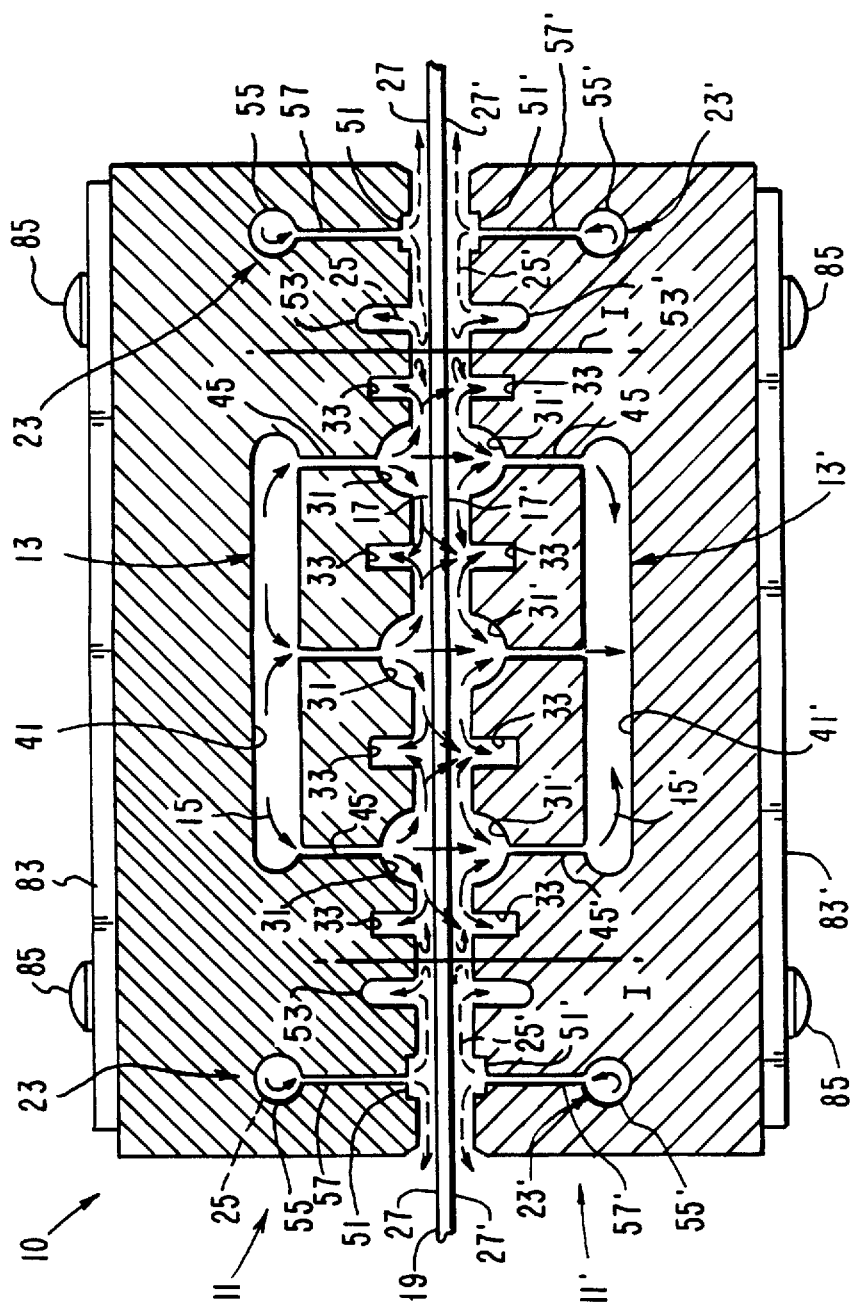
FIG. 2 is a side, elevational view, partly in section, of the resin impregnation device of FIG. 1 as taken along the line 2—2 in FIG. 1.

In the above example, the reinforcement 19 possesses an overall width (dimension W in FIG. 3) typically of about 70 inches and a thickness (dimension T in FIG. 3) typically of only about 0.001 inch. Reinforcements having thicknesses ranging from 0.0005 inch to about 0.5 inch may be successfully treated using the invention. As shown in FIG. 2, head member 11 further includes means 23 for directing a second fluid 25 (represented by the dashed arrows in FIG. 2) of an established second pressure substantially equal to or greater than the pressure of the first fluid 15, this second fluid 23 being directed to a predetermined location 27 on reinforcement 19 adjacent the first fluid location 17 which receives application of fluid 15. As seen in FIG. 2, the means for applying second fluid 25 directs this second fluid at opposite ends of the reinforcement's first location that is, the region of the reinforcement which is between the head members 11 and 11' at any particular time. Such application of the second fluid serves to substantially limit application of first fluid 15 to impingement substantially only on location 17, and at the approximate central area of the device 10. Location 17 is generally bounded by the two lines marked I—I in FIG. 2.

In one example of the invention (that using the aforementioned epoxy resin solution), nitrogen gas is the preferred fluid for the second fluid 25. As stated, the second fluid is at a pressure equal to or greater than the first fluid pressure to thus assure impingement of the first fluid to the desired location.

Device 10 is capable of treating reinforcements located therein wherein the reinforcement is either moving at an established rate or established in a fixed position relative to the device's structure. In the situation wherein reinforcement 19 is moving, the first fluid 15 will strike the surface adjacent head 11 substantially along the entirety thereof. However, the invention assures that such fluid application will only occur for a predetermined time to the location 17 illustrated in FIG. 2, thus assuring that the desired time periods for exposure to the particular fluids being applied will occur. Such time periods may of course be readily adjusted by corresponding adjustment to the reinforcement's rate of movement.

Preferably, device 10 has two head members, the second head member being represented by the numeral 11' in the drawings. Further, head 11' may be of identical configuration to that of the upper head 11 shown in FIG. 2. Thus, similar numerals will be used to identify similar structures. However, this is not to limit the invention, in that the second head may be of a different internal configuration while still achieving the proposed desire, that being to provide two fluid heads to provide precise fluid impingement is also provided by the lower head member (11'). The second head member also includes means 13' and 23' for directing fluids 15' and 25', respectively. This arrangement (two heads) is particularly desired to enhance fluid penetration and "wetting" of the reinforcement. Since most reinforcements possess a relatively porous configuration (having apertures or the like therethrough), it is advantageous to have means 13' under reduced pressure (e.g., vacuum) to direct fluid 15 through reinforcement 19 as shown in FIG. 2. Means 23', however, still remains under positive pressure directing fluid 25' in the direction shown in FIG. 2. This is advantageous to maintain the reinforcement at a spaced location (as shown in FIG. 2) and to substantially limit application of fluid 15 to impingement substantially only on location 17, and at the approximate central area of device 10.

Figure 3:
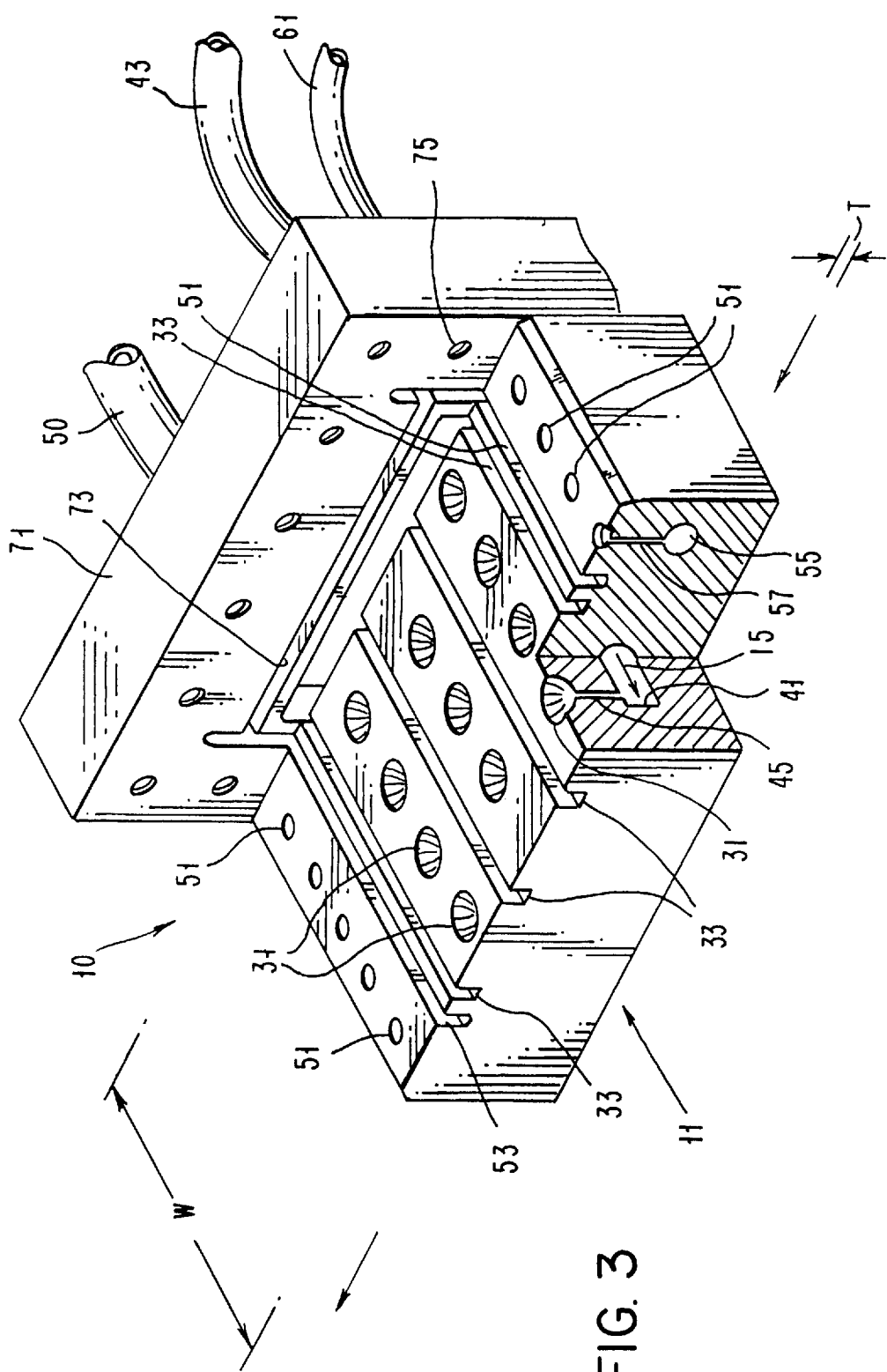
FIG. 3 is a perspective view, on a slightly reduced scale, of the resin impregnation device of FIG. 1, illustrating only one of the possible head members for use therein.

Means 13 for directing first fluid 15 comprises at least one inlet port 31 positioned within head member 11 and at least one outlet port 33 located relative to the inlet port. As seen in FIGS. 2 and 3, means 13 includes curvilinear side walls, said configurations deemed most appropriate for effective flow of fluids such as resins or the like in order to direct said fluids onto the adjacent reinforcement in the most effective manner. Significantly, the respective outlet ports 33 number only four, each one being located adjacent and with respect to a singular row of inlet ports 31. As seen in FIGS. 2 and 3, each outlet port is of a elongated configuration and thus constitutes a groove or slot within the head members upper surface. It has also been determined that linear (straight) sidewalls for these outlet ports provide the most effective means of fluid escape at this location, although these sidewalls may possess other configurations (e.g., curvilinear, tapered) and still provide effective fluid escape.

The first fluid 15 is preferably supplied to a common chamber 41 located in the head member from a common inlet tube 43 or the like connected to this common chamber. Fluid 15 is further passed through narrow passages 45 between the ports and common chamber to each of the respective curvilinear inlet ports. Withdrawal of fluid 15 after application to reinforcement 19 is accomplished by passage of this fluid mainly through reinforcement 19 and only slightly through the elongated grooves 33 which are preferably connected to a common duct (not shown) or the like whereupon these pass through an outlet tube 50 or the like. Tube 50 may in turn be connected to a recirculation means including a degassing mechanism, a pump and a viscosity controller. It is of course also possible to provide appropriate fluid treatments (e.g., filters, etc.) as part of this recirculation means.

It is understood that when two head members are utilized, the corresponding inlet and outlet ports for the remaining head member (e.g., 11') will be similarly connected to common outlet tubing, such as 43 and 50 as shown in FIG. 3; however, these being under reduced pressure (e.g., vacuum) to facilitate resin penetration and excessive removal.

As stated, fluid treatment device 10 maintains the treated reinforcement at the above cited spaced location from the respective head members during fluid application. This relatively narrow gap thus formed between product and the head member, coupled with high fluid rates of flow, in turn thus results in relatively high mass transfer and chemical processing rates for the invention. Understandably, the invention is thus readily adaptable to mass production techniques. Significantly, the device as described above thus assures capture of the first fluids as utilized herein to thus enable recycling thereof if desired. Such recapture serves to reduce the cost of manufacture associated with using the invention. Equally significant, because the respective second fluids serve to assist in such capture, any potentially harmful materials (e.g., pollutants) are thus contained with in the system.

It is understood that the maintaining of reinforcement 19 at the spaced distance from the head member's external surface results in a fluid bearing being formed along the surface, the reinforcement thus riding on said bearing during location within (including movement through) device 10 during fluid application.

Each of the means 23 and 23' for directing second fluid 25 and 25' comprises at least one inlet port 51 and 51' and a corresponding outlet port 53 and located relative thereto. As shown in FIGS. 2 and 3, a plurality (e.g., ten) of such inlet ports 51 are utilized for each head member, these inlet ports being arranged in two singular rows of five each (FIG. 3). The second fluid 25 is supplied to each of these rows of inlet ports through a common channel 55 (or 55' in the case of head member 11'), which fluid then passes upwardly or downwardly within the head through narrow passages 57 and 57' to the respective inlet ports. Each inlet port, as shown, includes substantially linear (straight) sidewalls, as do each of the corresponding outlet ports 53. As shown in FIG. 3, these outlet ports are preferably in the shape of an elongated channel of substantially similar configuration (excluding the lower surface thereof) to the adjacent outlet ports 33 for means 13. Thus, a total of only two such outlet ports 53 (or channels) for the second means 23 is provided within each head member. Each of the common inlet chamber 55 is in turn coupled to a common inlet tube 61 (FIG. 2), which tube is in turn connected to the suitable source (e.g., pump). Each of the outlet channels 53 are in turn preferably connected to a exhaust tube (not shown) or the like in order to achieve effective venting of the second fluid (nitrogen).

Figure 1:
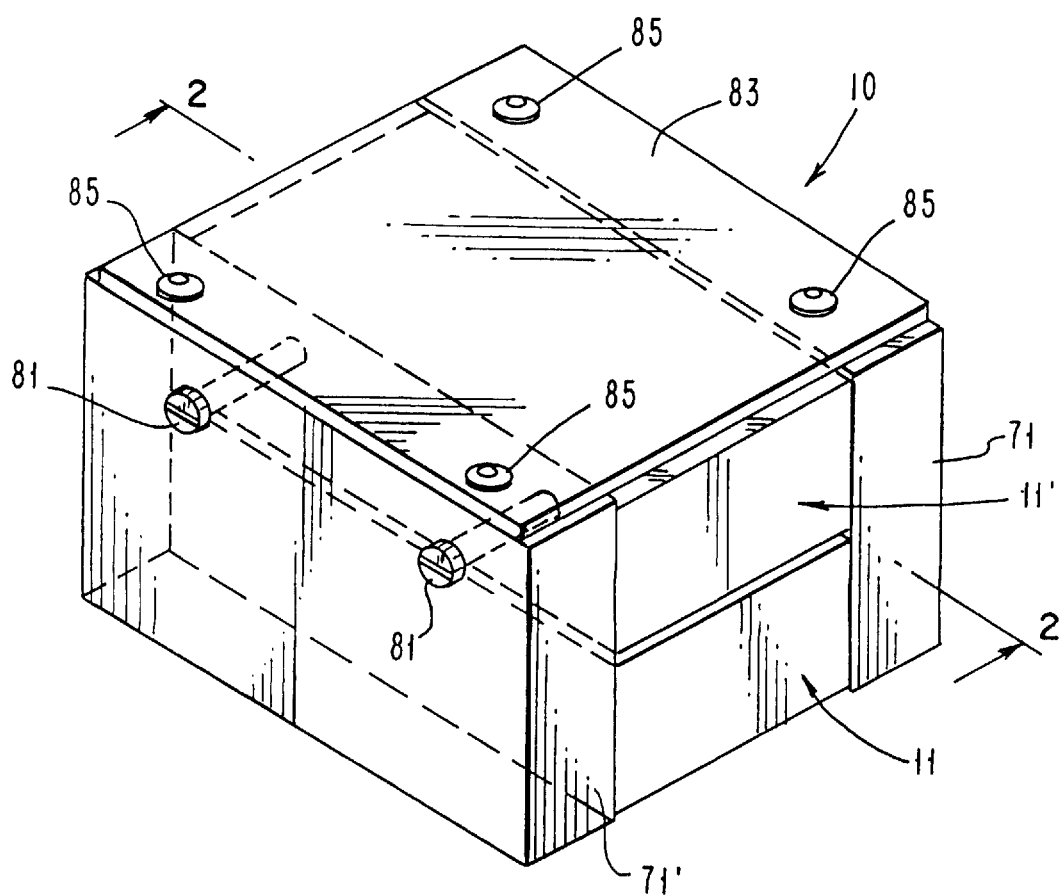
FIG. 1 is a perspective view of a fluid jet impregnation device in accordance with an embodiment of the invention.

As shown in FIG. 2, the locations of the intersection between the respective first and second fluids (represented by the lines I—I in FIG. 2) represent the external periphery for the first location to which the first fluid is applied to reinforcement 19. When using the fluids, pressures and port configurations cited above, the resulting fluid impingement along these intersection boundaries is of extremely fine resolution. That is, the line of demarcation between both fluids is clearly and precisely defined. Such precision is considered essential in the manufacture of structures such as prepregs and represents one of the highly advantageous features of the invention. As also shown in FIG. 3, device 10 further includes a common manifold 71 located adjacent the respective head members for assisting in receiving and withdrawing the fluids used in device 10. Common manifold 71 preferably includes a common, longitudinal groove 73 or the like to interconnect the described outlet ports 53. Additionally, the common manifold 71 further includes a plurality in inlet ports 75 which are in turn coupled to the respective head member (particularly to the common inlet chambers 55 thereof). Although only one such manifold is depicted in FIG. 3, it is understood that additional manifold members may be utilized in the invention to assist in fluid intake and withdrawal. In FIG. 1, for example, a second manifold may in turn be coupled to either or both of the respective head members 11 and 11'. The tubing associated with such manifolds is not shown in FIG. 1.

Figure 4:
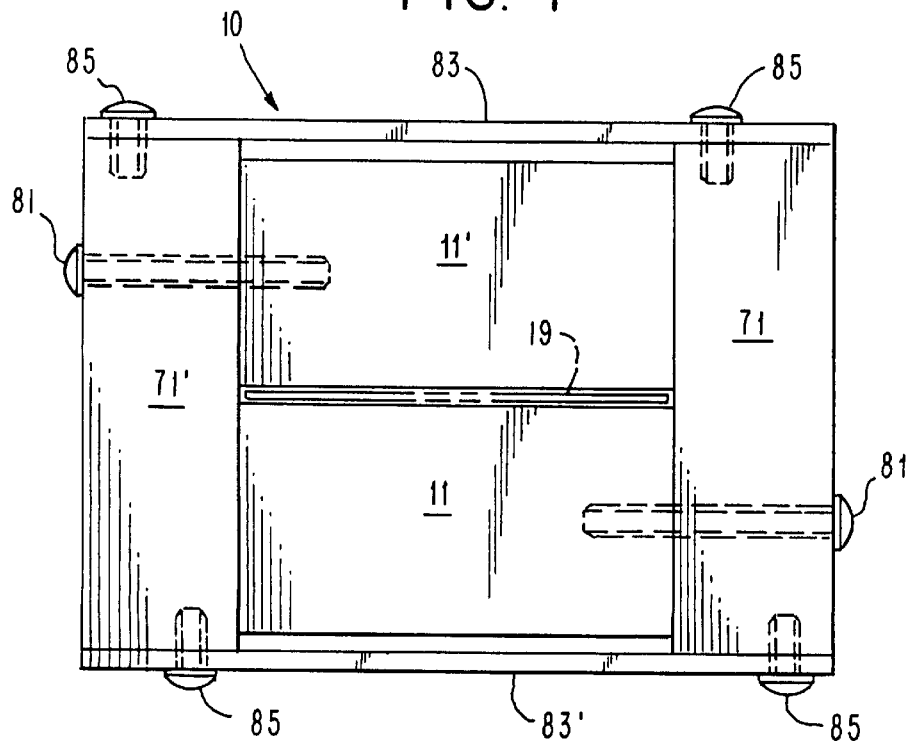
FIG. 4 is a front, elevational view on a slightly enlarged scale, illustrating the relative positioning between the head members of the invention during initial positioning of the reinforcement being treated therein.
Figure 5:
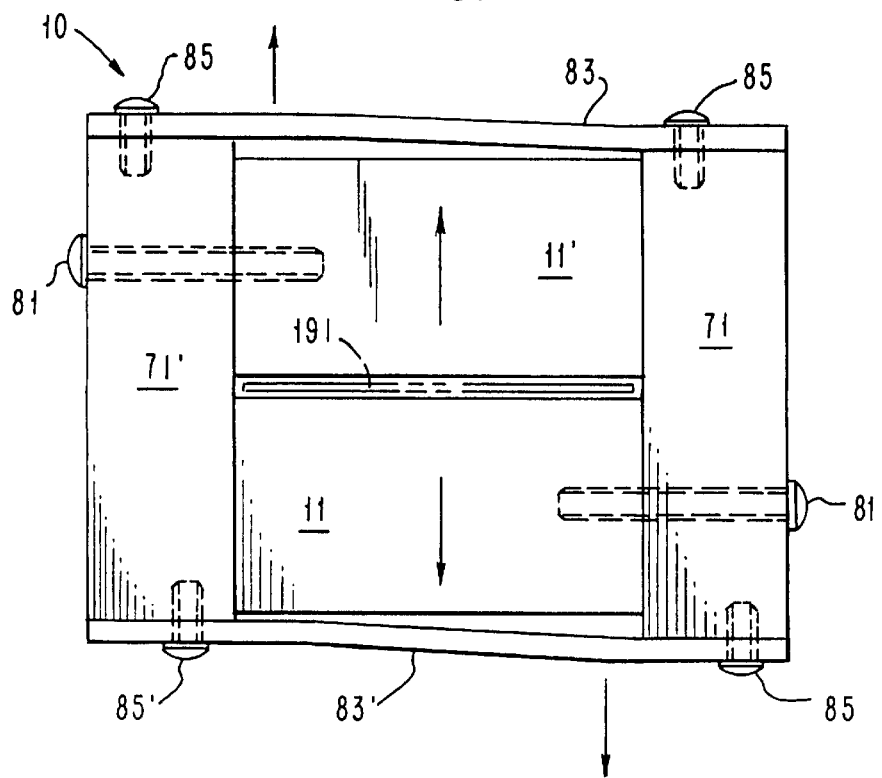
FIG. 5 is a front elevational view, substantially similar to the front elevational view in FIG. 4, illustrating the relative positioning of the head members of the invention during fluid application.

In FIGS. 4 and 5, a relative displacement of the two opposed head members 11 and 11' can be seen. In FIG. 4, each of the head member is shown in its original position prior to fluid application. Reinforcement 19 (indicated in phantom) is shown between both head members. Although a slight spacing is indicated in FIG. 4, it is understood that the reinforcement may in fact contact both of the adjacent external head surfaces prior to fluid application. As further shown in FIG. 4, each of the head members is connected (e.g., using screws 81) to a respective one of the adjacent manifold (side support) members 71 and 71'. A minimum of two such screws 81 is used for each respective head member and manifold subassembly (see FIG. 1). Each of these side manifold (side support) members is in turn mechanically connected to the other, opposing manifold member by a pair of bendable plate members 83 and 83'. Screws 85 (four per plate) are used to connect the plate to the upper and lower surfaces of each manifold member.

Thus, it can be seen in FIG. 5 that when fluid is applied, relative movement of both head members 11 and 11' will occur. In FIG. 5, head member 11' moves downwardly while head member 11 moves upwardly relative to the common reinforcement, which reinforcement is now located at the aforementioned spaced location from each of the respective head members. It is noted that each of the head members maintains its fixed position relative to the manifold connected thereto, but each such head member is able to move in the opposing manner as shown by virtue of the respective plate members 83 and 83' slightly deflecting (bending) in the manner indicated in FIG. 5.

Figure 6:
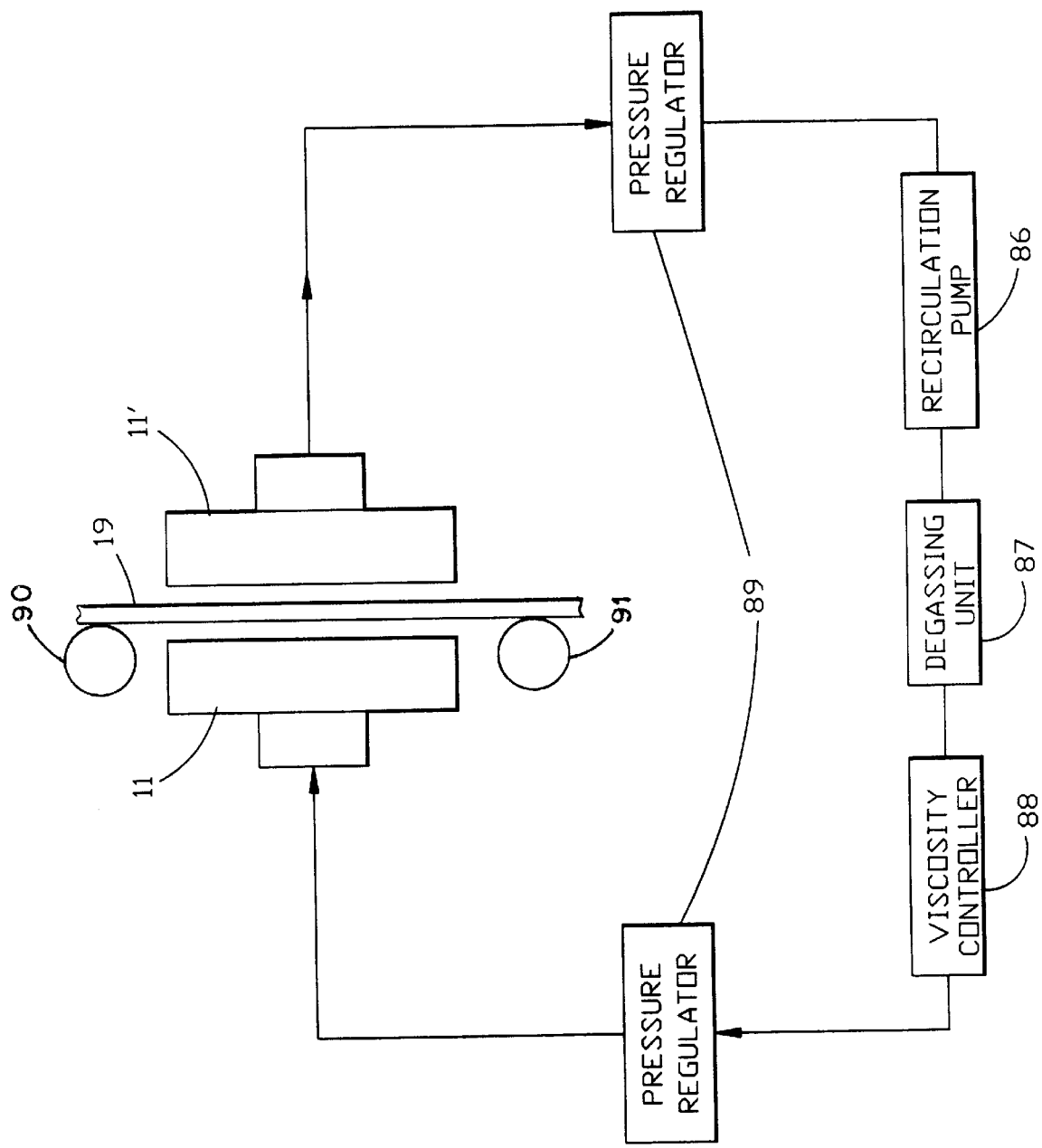
FIG. 6 is a generalized depiction of a fluid jet impregnation device including the head members, recirculation pump, degassing unit, viscosity controller and pressure regulators.

FIG. 6 is a generalized depiction of a fluid jet impregnation device including head members 11 and 11', feed and takeup rollers 90 and 91 recirculation pump 86, degassing unit 87, viscosity controller 88 and pressure regulators 89.

Thus there has been shown and described a fluid treatment device possessing the several highly advantageous features cited above. As stated, the device is readily adaptable for use with a variety of fluids, including epoxy resins, bismaleimide resins, cyanate ester resins, acrylic resins, air, nitrogen, etc. The device as described is of relatively simple construction and can thus be produced at relatively minor costs. Further, the device as described is readily adaptable for use in mass production, thereby even further reducing the cost of manufacture associated therewith.

The apparatus according to the present invention confers the volatile solvent containing resin to the space between head members 11 and 11' which is substantially free of oxygen. Since the amount of resin is small and due to the lack of oxygen, there is substantially no explosion hazard.

While the device design described in the in the aforementioned description of the present invention is preferred, additional device designs described by Bard et al. (U.S. Pat. Nos. 5,192,394 and 5,289,639) are also applicable and are hereby incorporated by reference. While there have been shown and described what are at present considered the preferred embodiments of the invention, it will be obvious to those skilled in the art that various changes and modifications may be made therein without departing from the scope of the invention as defined by the appended claims.

We claim:

1. An apparatus for applying fluid to a porous work piece to coat and impregnate the work piece comprising:

a head member, means for directing a fluid at a first positive pressure at one side of said work piece and across the surface of that side; and means for directing said fluid at a second negative pressure at the opposite side of said work piece and across the surface of that side so that said fluid is passed both over and through said work piece to thereby coat and impregnate the work piece.

2. An apparatus according to claim 1, wherein said fluid at said first pressure is directed to a location on said work piece.

3. An apparatus according to claim 1, wherein said head member comprises a plurality of fluid injectors.

4. An apparatus according to claim 1 wherein said head member comprises:

spaced apart first and second head members.

5. An apparatus according to claim 5, further including:

a means for transporting said work piece between said spaced apart first and second head members.

6. An apparatus according to claim 5, wherein said first head member is substantially parallel disposed with respect to said second head member; said means for transporting said work piece transports said work piece in a direction which is substantially parallel disposed between said first and said second head members.

7. An apparatus according to claim 6, wherein said first head members has a first plurality of fluid injectors and said second head member has a second plurality of fluid injectors.

8. An apparatus according to claim 7, wherein said first plurality of fluid jet injectors directs said fluid towards said work piece and wherein said second plurality of injectors directs said fluid away from said work piece.

9. An apparatus according to claim 8, wherein said plurality of fluid injectors are aligned transversely to the directional movement of said workpiece.

10. An apparatus according to claim 1 wherein said fluid is a chemical solution.

11. An apparatus according to claim 1 further including a means for controlling an amount of said fluid applied to said work piece.

12. An apparatus according to claim 11, wherein said means for controlling comprises means for controlling said first and said second pressure.

13. An apparatus according to claim 10, wherein said work piece is selected from the group consisting of a woven fabric, compressed mat, single filament fiber toe and, thin film sheet.

14. An apparatus according to claim 1, further including means for supplying a sheet of said work piece to said apparatus and a means for accepting said sheet from said apparatus.

15. An apparatus for injecting liquid into a porous work piece and across surfaces thereof to coat and impregnate the work piece with said liquid, said apparatus comprising:

a head member with a chamber therein and apertures at opposing ends thereof for passage of the work piece through the chamber, said chamber being formed by two spaced members flexibly joined together;

said first member having a set of recessed liquid injection and retraction means for directing liquid under positive pressure against and along a first surface of the work piece to coat the first surface and the second member having a set of recessed liquid extraction means for drawing said liquid with negative pressure through said porous work piece and along an opposite surface thereof to impregnate the porous work piece and coat the opposite surface;

transport means for moving said porous work piece into and out of the chambers through the apertures; and said first and second members each having gaseous fluid injection and extraction means interposed between the apertures and the liquid injection and extraction means to establish a gaseous barrier that contains the liquid within the chamber thereby controls the time that the porous work piece is exposed to the liquid under pressure.

16. The apparatus of claim 15 wherein said gaseous fluid is a noncombustive gas that prevents the liquid in the chamber mixing with oxygen in the air.

17. The apparatus of claim 15 wherein said gas is nitrogen.

18. The apparatus of claim 17 wherein said interior wall of said chamber is in close proximity to the top and bottom surfaces of the work piece and does not have obstructions that intrude between the chamber wall and said surfaces.

\* \* \* \* \*